United States Patent
Imori et al.

(10) Patent No.: US 8,318,313 B2
(45) Date of Patent: Nov. 27, 2012

(54) METHOD FOR SUPPORTING METAL NANOPARTICLES AND METAL NANOPARTICLES-CARRYING SUBSTRATE

(75) Inventors: Toru Imori, Kitaibaraki (JP); Yoshiyuki Hisumi, Kitaibaraki (JP); Junichi Ito, Kitaibaraki (JP); Tsukasa Torimoto, Nagoya (JP); Kenichi Okazaki, Nagoya (JP); Susumu Kuwabata, Suita (JP)

(73) Assignees: JX Nippon Mining & Metals Corporation, Tokyo (JP); Nagoya University, Aichi (JP); Osaka University, Osaka (JP)

( * ) Notice: Subject to any disclaimer, the term of this patent is extended or adjusted under 35 U.S.C. 154(b) by 476 days.

(21) Appl. No.: 12/678,509

(22) PCT Filed: Sep. 18, 2008

(86) PCT No.: PCT/JP2008/066869
§ 371 (c)(1),
(2), (4) Date: Mar. 30, 2010

(87) PCT Pub. No.: WO2009/038135
PCT Pub. Date: Mar. 26, 2009

(65) Prior Publication Data
US 2010/0215970 A1 Aug. 26, 2010

(30) Foreign Application Priority Data
Sep. 18, 2007 (JP) .................. 2007 241533

(51) Int. Cl.
*B32B 15/02* (2006.01)
*B05D 1/36* (2006.01)
*B05D 5/00* (2006.01)

(52) U.S. Cl. .......... 428/450; 427/58; 427/205; 427/404; 427/407.1; 428/209; 428/447; 428/451; 428/901

(58) Field of Classification Search .................. 427/58, 427/205, 404, 407.1; 428/209, 447, 450, 428/451, 901
See application file for complete search history.

(56) References Cited

U.S. PATENT DOCUMENTS
| | | | |
|---|---|---|---|
| 7,045,461 B2 | 5/2006 | Imori et al. | 438/678 |
| 2009/0306394 A1 | 12/2009 | Torimoto et al. | 548/101 |

FOREIGN PATENT DOCUMENTS
| | | |
|---|---|---|
| JP | 06-256358 | 9/1994 |
| JP | 2002-068782 | 3/2002 |
| JP | 2007-231306 | 9/2007 |
| WO | WO 01/49898 | 7/2001 |
| WO | WO 2006/132308 | 12/2006 |

*Primary Examiner* — D. S. Nakarani
(74) *Attorney, Agent, or Firm* — Drinker Biddle & Reath LLP

(57) ABSTRACT

A metal nano particle can be supported and immobilized on a substrate uniformly. Thus, disclosed is a method for supporting a nano metal particle, which comprises applying a silane coupling agent having at least one functional group capable of capturing a metal (e.g., an imidazole group, an amino group, a diamino group, a mercapto group, and a vinyl group) in its molecule on a substrate, and then contacting the silane coupling agent with a nano particle of a metal (e.g., gold, platinum, silver, copper, palladium, nickel, cobalt), wherein the silane coupling agent may be produced by the reaction between an azole compound with an epoxysilane compound, and wherein the metal nano particle to be contacted with the silane coupling agent is preferably coated with an ionic fluid. Also disclosed is a substrate having a metal nano particle supported thereon, which is produced by the method.

12 Claims, 1 Drawing Sheet

METHOD FOR SUPPORTING METAL NANOPARTICLES AND METAL NANOPARTICLES-CARRYING SUBSTRATE

BACKGROUND OF THE INVENTION

1. Field of the Invention

The present invention relates to a method for supporting metal nanoparticles and particularly to a method for fixing metal nanoparticles stabilized by a protective coating.

2. Background Art

Known methods for producing metal fine particles and obtaining nano-size (1 to 1,000 nm) metal particles (metal nanoparticles) include wet processes that includes producing metal particles in a solution with the aid of a chemical reaction, and dry processes that includes depositing metal nanoparticles directly on a substrate with the aid of vacuum technology. For example, Japanese Patent Application Laid-Open (JP-A) No. 2007-231306 and International Publication No. 2006/132308 disclose methods including depositing atoms or molecules constituting a nanoparticle precursor on an ionic liquid, which is a salt consisting of a cation(s) and an anion(s) and in a liquid state at room temperature, in which metal nanoparticles are produced by sputtering using a system and a procedure similar to those of chemical vapor deposition (CVD) or physical vapor deposition (PVD). More specifically, it is disclosed that the process includes placing a target and an ionic liquid in a vacuum chamber, applying an electric power to the target to perform sputtering to the ionic liquid, so that nanoparticles are produced on or in the ionic liquid.

SUMMARY OF INVENTION

However, the methods disclosed in the patent literatures are methods for producing metal nanoparticles, in which the nanoparticles are analyzed as they are in the ionic liquid, but not methods for supporting and fixing metal nanoparticles on a substrate. Techniques for supporting and fixing metal nanoparticles with a uniform size on a substrate may be used in a wide range of applications such as precise control of magnetic fine particles and formation of electrically-conductive films to form fine wiring structures. However, it is difficult for the above conventional techniques to fix metal nanoparticles on a substrate.

As a result of investigations in view of the above circumstances, the inventors have made the invention based on the finding that the fixation of metal nanoparticles on a substrate, which is difficult for the conventional techniques, is made possible by coating the substrate with a coupling agent having metal-trapping ability.

The present invention, which has been made based on the finding, is directed to:

(1) a method for supporting metal nanoparticles, including applying, to a substrate, a silane coupling agent having at least one functional group with metal-trapping ability per molecule and then bringing metal nanoparticles into contact with the substrate;

(2) the method according to item (1), wherein the metal nanoparticles brought into contact with the substrate are covered with an ionic liquid;

(3) the method according to item (1) or (2), wherein the silane coupling agent having a functional group with metal-trapping ability is a silane coupling agent obtained by the reaction of an azole compound with an epoxy-silane compound;

(4) the method according to any one of items (1) to (3), wherein the functional group with metal-trapping ability is at least one selected from the group consisting of an imidazole group, an amino group, a diamino group, a mercapto group, and a vinyl group;

(5) the method according to any one of items (1) to (4), wherein the metal of the metal nanoparticles is an alloy of at least one selected from the group consisting of gold, platinum, silver, copper, palladium, nickel, cobalt, ruthenium, rhodium, rhenium, manganese, chromium, molybdenum, tungsten, niobium, tantalum, titanium, zirconium, hafnium, zinc, cadmium, aluminum, gallium, indium, tin, and silicon, an alloy of two or more of the above metals, or a metal containing at least one of the above metals;

(6) a metal plating method according to any one of items (1) to (5), wherein the metal nanoparticles brought into contact with the silane coupling agent are covered with an ionic liquid; and (7) a substrate carrying metal nanoparticles obtained by the method according to any one of items (1) to (6).

The method of the present invention can stabilize metal nanoparticles with a protective ionic-liquid coating, so that when brought into contact with a substrate treated with a silane coupling agent having metal nanoparticle-trapping ability, the metal nanoparticles can be uniformly supported and fixed on the substrate without undergoing undesired reactions such as oxidation. Therefore, the method of the present invention is very useful for precise control of magnetic fine particles and formation of electrically-conductive films to form fine wiring structures, particularly, for the manufacture of a silicon substrate for LSI wiring.

BRIEF DESCRIPTION OF DRAWINGS

FIG. 1 is an electron micrograph of Example 1a;
FIG. 3 is an electron micrograph of Comparative Example 1a.

DESCRIPTION OF THE PREFERRED EMBODIMENT

Figure 1:
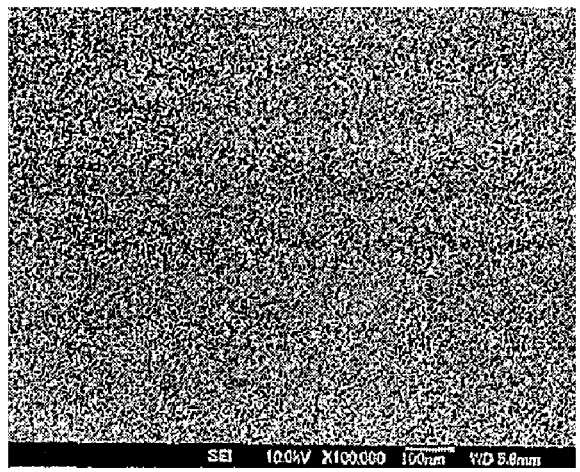

In an embodiment of the present invention, the substrate to be coated with the silane coupling agent is preferably a silicon substrate, while the substrate may be of any type that suits the metal coating purpose and makes the method of the present invention possible.

The functional group with metal-trapping ability which the silane coupling agent carries may be a functional group having the ability to associate with or bond to metal, such as an imidazole group, an amino group, a diamino group, a mercapto group, or a vinyl group.

The term "silane coupling agent" is intended to include a molecule having an ethoxy (or methoxy) group capable of producing a silanol (Si—OH) group by hydrolysis at one end and having an organic functional group (such as an amino group or a glycidyl group) at the other end.

As an example of the silane coupling agent having a functional group with metal-trapping ability, a silane coupling agent obtained by the reaction of an azole compound with an epoxy-silane compound can be mentioned. Examples of the azole compound include imidazole, oxazole, thiazole, selenazole, pyrazole, isoxazole, isothiazole, triazole, oxadiazole, thiadiazole, tetrazole, oxatriazole, thiatriazole, bendazole, indazole, benzimidazole, benzotriazole, and so on. The epoxy-silane compound is preferably an epoxy-silane coupling agent represented by the formula:

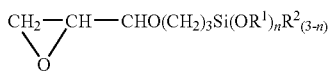

wherein $R^1$ and $R^2$ each represent hydrogen or an alkyl group of 1 to 3 carbon atoms, and n represents an integer of 1 to 3.

For example, the reaction of an azole compound with an epoxy-silane compound may be performed under the conditions described in JP-A No. 06-256358. For example, at 80 to 200° C., 0.1 to 10 moles of an epoxy group-containing silane compound is added dropwise to 1 mole of an azole compound, and the reaction is performed from 5 minutes to 2 hours. While the reaction does not necessarily require a solvent, an organic solvent such as chloroform, dioxane, methanol, or ethanol may be used.

Specific examples of the silane coupling agent having a functional group with metal-trapping ability include imidazolesilane, 3-aminopropyltrimethoxysilane, N-2-(aminoethyl)-3-aminopropyltrimethoxysilane, N-2-(aminoethyl)-3-aminopropyltriethoxysilane, and vinylsilane, 3-mercaptopropyltrimethoxysilane, and vinylsilane.

A solution of the silane coupling agent to be applied to the substrate may be prepared by a method of simply dissolving an appropriate amount of the desired silane coupling agent in a solvent such as water, an alcohol such as methyl alcohol or ethyl alcohol, or an aromatic hydrocarbon such as toluene or xylene.

The silane coupling agent may be applied by a method conventionally used by a person skilled in the art, examples of which include spin coating and immersion.

The metal of the metal nanoparticles is used to be supported and fixed on the substrate. For example, the metal may be an alloy of at least one selected from the group consisting of gold, platinum, silver, copper, palladium, nickel, cobalt, ruthenium, rhodium, rhenium, manganese, chromium, molybdenum, tungsten, niobium, tantalum, titanium, zirconium, hafnium, zinc, cadmium, aluminum, gallium, indium, tin, and silicon, an alloy of two or more of the above metals, such as a platinum-palladium alloy, a palladium-copper alloy, or a copper-silver alloy, or a metal containing at least one of the above metals, such as tungsten-palladium or tantalum-palladium. The metal may also be in the form of a nitride such as TaN or TiN or a silicide such as NiSi or CoSi.

The metal nanoparticles preferably have a particle size of several nm to several hundred nm, in particular, 2 to 100 nm. The metal nanoparticles may be contained and protected in the ionic liquid described below, when they are brought into contact with the silane coupling agent.

As used herein, the ionic liquid is meant to include a compound that consists of a cation(s) and an anion(s) and is in a liquid state at room temperature. The ionic liquid is stable at high temperature and has properties such as a wide liquid-phase temperature range, a very low vapor pressure, a low viscosity, and high resistance to oxidation and reduction. The ionic liquid suitable for use in the present invention may be hydrophilic or hydrophobic, and examples include an aliphatic-type ionic liquid, an imidazolium-type ionic liquid, and a pyridinium-type ionic liquid.

Examples of the aliphatic-type ionic liquid include N,N,N-trimethyl-N-propylammonium bis(trifluoromethanesulfonyl)imide, N-methyl-N-propylpiperidinium bis(trifluoromethanesulfonyl)imide, N,N-diethyl-N-methyl-N-(2-methoxyethyl)ammonium bis(trifluoromethanesulfonyl)imide, and N,N-diethyl-N-methyl-N-(2-methoxyethyl) ammonium tetrafluoroborate.

Examples of the imidazolium-type ionic liquid include 1,3-dialkylimidazolium salts and 1,2,3-trialkylimidazolium salts. Examples of 1,3-dialkylimidazolium salts include 1-ethyl-3-methylimidazolium bromide, 1-ethyl-3-methylimidazolium chloride, 1-ethyl-3-methylimidazolium (L)-lactate, 1-ethyl-3-methylimidazolium hexafluorophosphate, 1-ethyl-3-methylimidazolium tetrafluoroborate, 1-butyl-3-methylimidazolium chloride, 1-butyl-3-methylimidazolium hexafluorophosphate (BMI-PF6), 1-butyl-3-methylimidazolium tetrafluoroborate, 1-butyl-3-methylimidazolium trifluoromethanesulfonate, 1-butyl-3-methylimidazolium (L)-lactate, 1-hexyl-3-methylimidazolium bromide, 1-hexyl-3-methylimidazolium chloride, 1-hexyl-3-methylimidazolium hexafluorophosphate, 1-hexyl-3-methylimidazolium tetrafluoroborate, 1-hexyl-3-methylimidazolium trifluoromethanesulfonate, 1-octyl-3-methylimidazolium chloride, 1-octyl-3-methylimidazolium hexafluorophosphate, 1-decyl-3-methylimidazolium chloride, 1-dodecyl-3-methylimidazolium chloride, 1-tetradecyl-3-methylimidazolium chloride, 1-hexadecyl-3-methylimidazolium chloride, and 1-octadecyl-3-methylimidazolium chloride. Examples of 1,2,3-trialkylimidazolium salts include 1-ethyl-2,3-dimethylimidazolium bromide, 1-ethyl-2,3-dimethylimidazolium chloride, 1-butyl-2,3-dimethylimidazolium bromide, 1-butyl-2,3-dimethylimidazolium chloride, 1-butyl-2,3-dimethylimidazolium tetrafluoroborate, 1-butyl-2,3-dimethylimidazolium trifluoromethanesulfonate, 1-hexyl-2,3-dimethylimidazolium bromide, 1-hexyl-2,3-dimethylimidazolium chloride, 1-hexyl-2,3-dimethylimidazolium tetrafluoroborate, and 1-hexyl-2,3-dimethylimidazolium trifluoromethanesulfonate.

Examples of the pyridinium-type ionic liquid include ethylpyridinium salts, butylpyridinium salts, and hexylpyridinium salts. Examples of ethylpyridinium salts include 1-ethylpyridinium bromide and 1-ethylpyridinium chloride. Examples of butylpyridinium salts include 1-butylpyridinium bromide, 1-butylpyridinium chloride, 1-butylpyridinium hexafluorophosphate, 1-butylpyridinium tetrafluoroborate, and 1-butylpyridinium trifluoromethanesulfonate. Examples of hexylpyridinium salts include 1-hexylpyridinium bromide, 1-hexylpyridinium chloride, 1-hexylpyridinium hexafluorophosphate, 1-hexylpyridinium tetrafluoroborate, and 1-hexylpyridinium trifluoromethanesulfonate.

The step of applying the silane coupling agent to the substrate is followed by the step of bringing the substrate into contact with the metal nanoparticles covered with the ionic liquid. Examples of the steps are described in time sequence below.

The substrate is washed with an acid solution and a strong acid. The substrate is immersed in a solution of the silane coupling agent, or a solution of the silane coupling agent is applied to the substrate by spin coating. If necessary, a solvent is selected and used for washing, and then the substrate is dried by heating. When spin coating is performed, the coated substrate may be rotated on the spin coater for several minutes.

After the ionic liquid is dried by heating under reduced pressure, metal nanoparticles are deposited thereon by sputtering. The ionic liquid containing the metal nanoparticles obtained by sputtering is added dropwise onto the coated substrate, and the ionic liquid spread over the surface of the substrate is removed by drying under reduced pressure, so that metal nanoparticles supported on the substrate are obtained. Alternatively, previously prepared metal nanoparticles are protected by mixing them with the ionic liquid, and the mixture is added dropwise to the substrate coated with the silane coupling agent. The ionic liquid spread over the surface of the substrate is removed by drying under reduced pressure, so that metal nanoparticles supported on the substrate are obtained.

The metal nanoparticles supported by the method of the present invention may then be subjected to electroless plating, depending on the type of the supported metal.

Some examples of the present invention are described below, which are not intended to limit the scope of the present invention.

EXAMPLES (1) Other than the case where imidazolesilane was used, different methanol solutions each containing 3 g/L of any one of the silane coupling agents shown below, were prepared and used. Each purchased silane coupling agent was used without purification.

γ-aminopropyltrimethoxysilane (KBM-903 (trade name), manufactured by Shin-Etsu Chemical Co., Ltd.)

Diaminosilane (N-2-(aminoethyl)-3-aminopropyltrimethoxysilane) (KBM-603 (trade name), manufactured by Shin-Etsu Chemical Co., Ltd.)

Mercaptosilane (3-mercaptopropyltrimethoxysilane) (KBM-803 (trade name), manufactured by Shin-Etsu Chemical Co., Ltd.)

Vinylsilane (vinyltrimethoxysilane) (KBM-1003 (trade name), manufactured by Shin-Etsu Chemical Co., Ltd.)

Tetramethoxysilane (KBM-04 (trade name), manufactured by Shin-Etsu Chemical Co., Ltd.)

(2) Imidazolesilane (IS-1000 (trade name), manufactured by Nippon Mining & Metals Co., Ltd.) was used. Under stirring, 1 cm$^3$ of pure water, 0.1 cm$^3$ of ammonia water, and 1 cm$^3$ of imidazolesilane were added in this order, and the mixture was allowed to stand overnight to form a silane coupling agent solution.

A substrate was coated with each silane coupling agent solution by an immersion method or a spin coating method, and metal nanoparticles covered with an ionic liquid were deposited on the substrate according to the procedure described below.

Under ultrasonic irradiation, a silicon substrate was washed with a hydrochloric acid methanol solution (methanol/hydrochloric acid=1) and concentrated sulfuric acid, respectively, for 10 minutes.

Immersion Method

The silicon substrate was immersed in the silane coupling agent solution at 60° C. for 5 minutes and washed with water. The substrate was then dried at 100° C. for 10 minutes.

Spin Coating Method

The silane coupling agent solution was applied to the substrate by spin coating (2,000 rpm, 10 seconds) and heated at 120° C. for 30 minutes.

Sputtering of Metal Nanoparticles to Ionic Liquid

The ionic liquid used was 1-butyl-3-methylimidazolium hexafluorophosphate (BMI-PF6), manufactured by Kanto Chemical Co., Inc. After drying under reduced pressure at 105° C. for 3 hours, sputtering deposition was performed. An Au target manufactured by Nippon Mining & Metals Co., Ltd. was used. The sputtering deposition was performed using the system and procedure described below.

1 cm$^3$ of BMI-PF6 was uniformly placed on a slide glass (26 mm×76 mm). At this time, BMI-PF6 did not spill from the slide glass because of its surface tension. The slide glass was gently placed in a vapor deposition system (Model IB-3 manufactured by EIKO ENGINEERING CO., LTD.). The Au target (in the form of a disc 50 mm in diameter and 0.1 mm in thickness) was placed opposite to the BMI-PF6, and sputtering was performed (argon in the vapor deposition chamber, a pressure of 20 Pa, an evaporation current of 40 mA, a reaction time of 300 seconds). After the sputtering, the BMI-PF6 solution (ionic liquid) was collected from the surface of the slide glass.

Deposition of Metal Nanoparticles on Substrate 25 mm$^3$ of the resulting ionic liquid was added dropwise onto the 3 cm$^2$ surface of the silicon substrate prepared as described above. The ionic liquid was uniformly spread over the surface of the silicon substrate but did not spill from the silicon substrate because of its surface tension. The substrate was dried under reduced pressure at 150° C. for 30 minutes and then washed with acetonitrile.

The evaluation results were obtained as follows. Images obtained using FE-SEM at a magnification of 20,000 to 200,000 were visually observed, and cases where Au particles with a uniform size were present in a relatively uniform manner without being aggregated were indicated by the mark "+", cases where Au particles with a relatively uniform and large size were uniformly and densely present were indicated by the mark "++", and cases where Au particles were sparsely present or aggregated were indicated by the mark "−."

Figure 2:
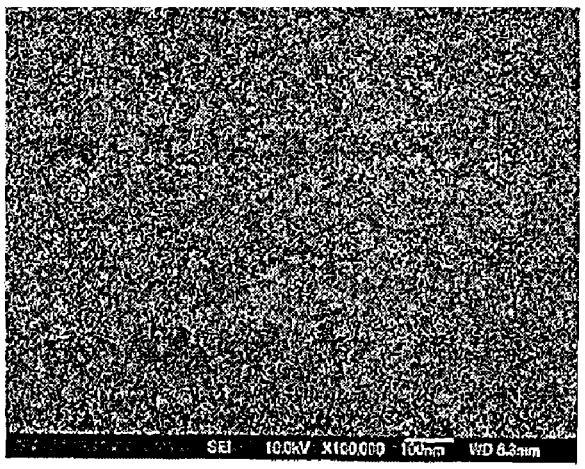
FIG. 2 is an electron micrograph of Example 1c.
Figure 3:
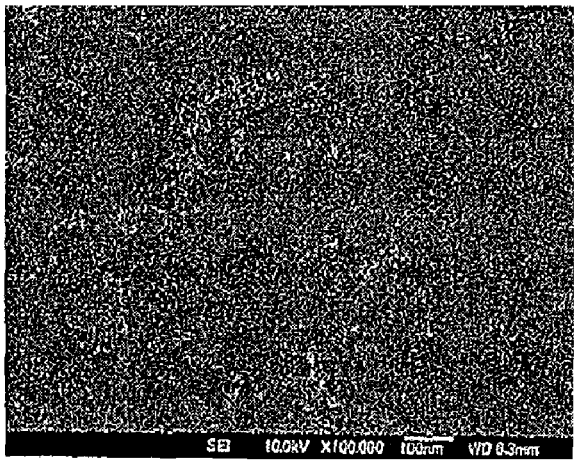

Table 1 provides a summary of the results obtained with the different silane coupling agents. FIGS. 1, 2 and 3 show an electron micrograph of Example 1a (at a magnification of 100,000, evaluated as "+"), that of Example 1c (at a magnification of 100,000, evaluated as "++"), and that of Comparative Example 1 (at a magnification of 100,000, evaluated as "−"), respectively.

TABLE 1

|  | Silane coupling agent | Silane coupling agent application method | | | Evaluation results |
|---|---|---|---|---|---|
|  |  | First | Second | Third |  |
| Example 1a | Imidazolesilane (applied once) | Immersion | Absent | Absent | + |
| Example 1b | Imidazolesilane (applied twice) | Immersion | Immersion | Absent | ++ |
| Example 1c | Imidazolesilane (applied three times) | Immersion | Immersion | Immersion | ++ |
| Example 2a | γ-aminopropyltrimethoxysilane (applied once) | Immersion | Absen | Absent | + |
| Example 2b | γ-aminopropyltrimethoxysilane (applied twice) | Immersion | Immersion | Absent | + |
| Example 2c | γ-aminopropyltrimethoxysilane (applied three times) | Immersion | Immersion | Immersion | + |
| Example 3a | Diaminosilane (applied once) | Immersion | Absent | Absent | + |
| Example 3b | Diaminosilane (applied twice) | Immersion | Immersion | Absent | + |
| Example 3c | Diaminosilane (applied three times) | Immersion | Immersion | Immersion | + |
| Example 4a | Mercaptosilane (applied once) | Immersion | Absent | Absent | − |

TABLE 1-continued

|  | Silane coupling agent | Silane coupling agent application method | | | Evaluation results |
|---|---|---|---|---|---|
|  |  | First | Second | Third |  |
| Example 4b | Mercaptosilane (applied twice) | Immersion | Immersion | Absent | − |
| Example 4c | Mercaptosilane (applied three times) | Immersion | Immersion | Immersion | + |
| Example 5a | Vinylsilane (applied once) | Immersion | Absent | Absent | − |
| Example 5b | Vinylsilane (applied twice) | Immersion | Immersion | Absent | − |
| Example 5c | Vinylsilane (applied three times) | Immersion | Immersion | Immersion | + |
| Comparative Example 1a | No treatment | Absent | Absent | Absent | − |
| Comparative Example 2a | Tetramethoxysilane (applied once) | Immersion | Absent | Absent | − |
| Comparative Example 2b | Tetramethoxysilane (applied twice) | Immersion | Immersion | Absent | − |
| Comparative Example 2c | Tetramethoxysilane (applied three times) | Immersion | Immersion | Immersion | − |
| Comparative Example 2d | Tetramethoxysilane (applied three times) | Spin coating | Spin coating | Spin coating | − |

"Absent" means that no coating treatment was performed.

The above descriptions show that the imidazolesilane treatment is most effective, while tetramethoxysilane is less effective in supporting Au, because the methoxy group has no metal-trapping ability.

Although not shown in the table, spin coating of the silane coupling agents according to the present invention was also effective, as was the immersion method.

What is claimed is:

1. A method for supporting metal nanoparticles, comprising applying, to a substrate, a silane coupling agent having at least one functional group with metal-trapping ability per molecule and then bringing metal nanoparticles into contact with the substrate, the functional group with metal-trapping ability being selected from the group consisting of an imidazole group and a vinyl group.

2. The method according to claim 1, wherein the functional group with metal-trapping ability is an imidazole group.

3. The method according to claim 1 wherein each metal nanoparticle comprises a metal nitride or a metal silicid.

4. The method according to claim 1, wherein the metal nanoparticles brought into contact with the silane coupling agent are covered with an ionic liquid.

5. The method according to claim 4, wherein the ionic liquid is selected from the group consisting of N,N,N-trimethyl-N-propylammonium bis(trifluoromethanesulfonyl)imide, N-methyl-N-propylpiperidinium bis(trifluoromethanesulfonyl)imide, N,N-diethyl-N-methyl-N-(2-methoxyethyl)ammonium bis(trifluoromethanesulfonyl)imide, and N,N-diethyl-N-methyl-N-(2-methoxyethyl)ammonium tetrafluoroborate.

6. The method according to claim 1, wherein the metal nanoparticles form wiring.

7. The method according to claim 1, wherein the metal of the metal nanoparticles is an alloy of two or more metals selected from the group consisting of gold, platinum, silver, copper, palladium, nickel, cobalt, ruthenium, rhodium, rhenium, manganese, chromium, molybdenum, tungsten, niobium, tantalum, titanium, zirconium, hafnium, zinc, cadmium, aluminum, gallium, indium, tin, and silicon.

8. The method according to claim 1, wherein the metal of the metal nanoparticles is a metal containing at least one of gold, platinum, silver, copper, palladium, nickel, cobalt, ruthenium, rhodium, rhenium, manganese, chromium, molybdenum, tungsten, niobium, tantalum, titanium, zirconium, hafnium, zinc, cadmium, aluminum, gallium, indium, tin or silicon.

9. The method according to claim 4, wherein the ionic liquid is selected from the group consisting of 1,3-dialkylimidazolium salts and 1,2,3-trialkylimidazolium salts.

10. The method according to claim 4, wherein the ionic liquid is selected from the group consisting of ethylpyridinium salts, butylpyridinium salts and hexylpyridinium salts.

11. The method according to claim 1, wherein each metal nanoparticle comprises at least one of TaN, TiN, NiSi, and CoSi.

12. A metal nanoparticles-carrying substrate obtained by the method according to claim 1.

* * * * *